(12) United States Patent
Go

(10) Patent No.: US 6,628,222 B2
(45) Date of Patent: Sep. 30, 2003

(54) IMAGE PROCESSING APPARATUS HAVING A/D CONVERTER

(75) Inventor: Dong-jin Go, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/124,726

(22) Filed: Apr. 18, 2002

(65) Prior Publication Data

US 2002/0190882 A1 Dec. 19, 2002

(30) Foreign Application Priority Data

Jun. 13, 2001 (KR) ........................................ 2001-33244

(51) Int. Cl.$^7$ ................................................ H03M 1/12
(52) U.S. Cl. ........................................ 341/155; 348/678
(58) Field of Search ........................ 341/155; 348/678, 348/679, 735, 536, 572

(56) References Cited

U.S. PATENT DOCUMENTS 4,434,439 A * 2/1984 Steckler et al. ............. 358/174
5,614,948 A * 3/1997 Hannah ...................... 348/255

* cited by examiner

Primary Examiner—Peguy JeanPierre
Assistant Examiner—Joseph J Lauture
(74) Attorney, Agent, or Firm—Sughrue Mion, PLLC

(57) ABSTRACT

An image processing apparatus inputs analog YUV or RGB signals, which are controlled to automatically control a gain and have uniform levels of synchronous signals, into an ADC so that the dynamic range in the ADC is optimized. The image processing apparatus converts analog luminance and chrominance signals into digital luminance and chrominance signals, and includes an automatic gain control signal generating means, and a plurality of automatic gain control amplifiers. The automatic gain control signal generating means generates an automatic gain control signal, which controls the levels of the analog luminance and chrominance signals, using the level of a synchronous signal detected from a digital Y luminance signal output from the ADC. The automatic gain control amplifiers amplify the levels of an analog luminance and chrominance signals by predetermined values using the automatic gain control signal and transmit the amplified levels to the ADC. Thus, the saturation phenomenon can be prevented from occurring in the digital $Y_d U_d V_d$ or $R_d G_d B_d$ signals.

8 Claims, 2 Drawing Sheets

IMAGE PROCESSING APPARATUS HAVING A/D CONVERTER

BACKGROUND OF THE INVENTION

1. Field of the Invention

The present invention relates to an image processing apparatus having an analog/digital converter (hereinafter, referred to as "ADC"), and more particularly, to an image processing apparatus having an ADC capable of securing a dynamic range for the levels of input analog YUV or RGB signals when converting the input analog YUV or RGB signals into digital YUV or RGB signals. The present application is based on Korean Application No. 2001-33244, filed Jun. 13, 2001, which is incorporated herein by reference.

2. Description of the Related Art

Image processing apparatuses having an ADC include TV, DVD, PC, and the like. These image processing apparatuses convert analog YUV or RGB signals into digital YUV or RGB signals using the ADC and process an image signal using the digital YUV or RGB signals. For example, in order to convert input analog YUV or RGB signals into a desired format, the input analog YUV or RGB signals are first converted into the digital YUV or RGB signal using an ADC and then the digital YUV or RGB signal are converted into a desired format.

However, the levels of the input analog YUV or RGB signals vary depending on image processing apparatuses. Thus, the levels of the input analog YUV or RGB signals may exceed the dynamic range in the ADC. In this case, the ADC cannot process all of the levels of the input analog YUV or RGB signals. In other words, a saturation phenomenon occurs in the ADC. Then, a screen is not normally displayed. The levels of the input YUV or RGB signals may be much lower than the standard signal level, which may be processed by the ADC. In this case, the quality of the screen is deteriorated.

Accordingly, in the prior art, a method of using an ADC with wide headroom is proposed to secure the dynamic range in the ADC for analog YUV or RGB signals having a wide variable width in each of the image processing apparatuses. However, the ADC obtains a digital signal, which deteriorates bit resolution compared to the original signal if the levels of the input YUV or RGB signals are too much lower than the standard signal level, which is processed by the ADC.

SUMMARY OF THE INVENTION

To solve the above-described problems, it is an object of the present invention to provide an image processing apparatus for inputting analog YUV or RGB signals, which are controlled to automatically control a gain and have uniform levels of synchronous signals, into an ADC so that the dynamic range in the ADC is optimized.

Accordingly, to achieve the above object, there is provided an image processing apparatus having an analog/digital converter (ADC) for converting input analog luminance and chrominance signals into digital luminance and chrominance signals. The image processing apparatus includes an automatic gain control signal generating means, an automatic gain control amplifier, and a plurality of automatic gain control amplifiers. The automatic gain control signal generating means generates an automatic gain control signal, which controls the levels of the analog luminance and chrominance signals, using the level of a synchronous signal detected from a digital Y luminance signal output from the ADC. The automatic gain control amplifier amplifies the level of an analog Y luminance signal by a predetermined value using the automatic gain control signal generated in the automatic gain control signal generator and transmits the amplified level of the analog Y luminance signal to the ADC. The plurality of automatic gain control amplifiers amplify the levels of analog UV chrominance signals corresponding to the analog Y luminance signal by predetermined values using the automatic gain control signal generated in the automatic gain control signal generator and transmit the amplified levels of analog UV chrominance signals to the ADC.

It is preferable that the automatic gain control amplifier amplifies the level of a synchronous signal contained in the analog Y luminance signal by a predetermined value, and the plurality of automatic gain control amplifiers amplify the levels of synchronous signals contained in the analog UV chrominance signals by predetermined values.

To achieve the above object, there is provided an image processing apparatus having an ADC for converting input analog RGB color signals into digital RGB color signals. The image processing apparatus includes an automatic gain control signal generator, an automatic gain control amplifier, and a plurality of automatic gain control amplifiers. The automatic gain control signal generator generates an automatic gain control signal, which controls the levels of the analog RGB color signals using the level of a synchronous signal detected from a first color signal of the digital RGB color signals. The automatic gain control amplifier amplifies the analog level of the first color signal by a predetermined value using the automatic gain control signal generated in the automatic gain control signal generator and transmits the analog level of the first color signal to the ADC. The plurality of automatic gain control amplifiers amplify the levels of analog color signals corresponding to the first color signal by predetermined values using the automatic gain control signal generated in the automatic gain control signal generator and transmit the levels of the analog color signals to the ADC.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, a preferred embodiment of the present invention will be described in detail with reference to the attached drawings.

Figure 1:
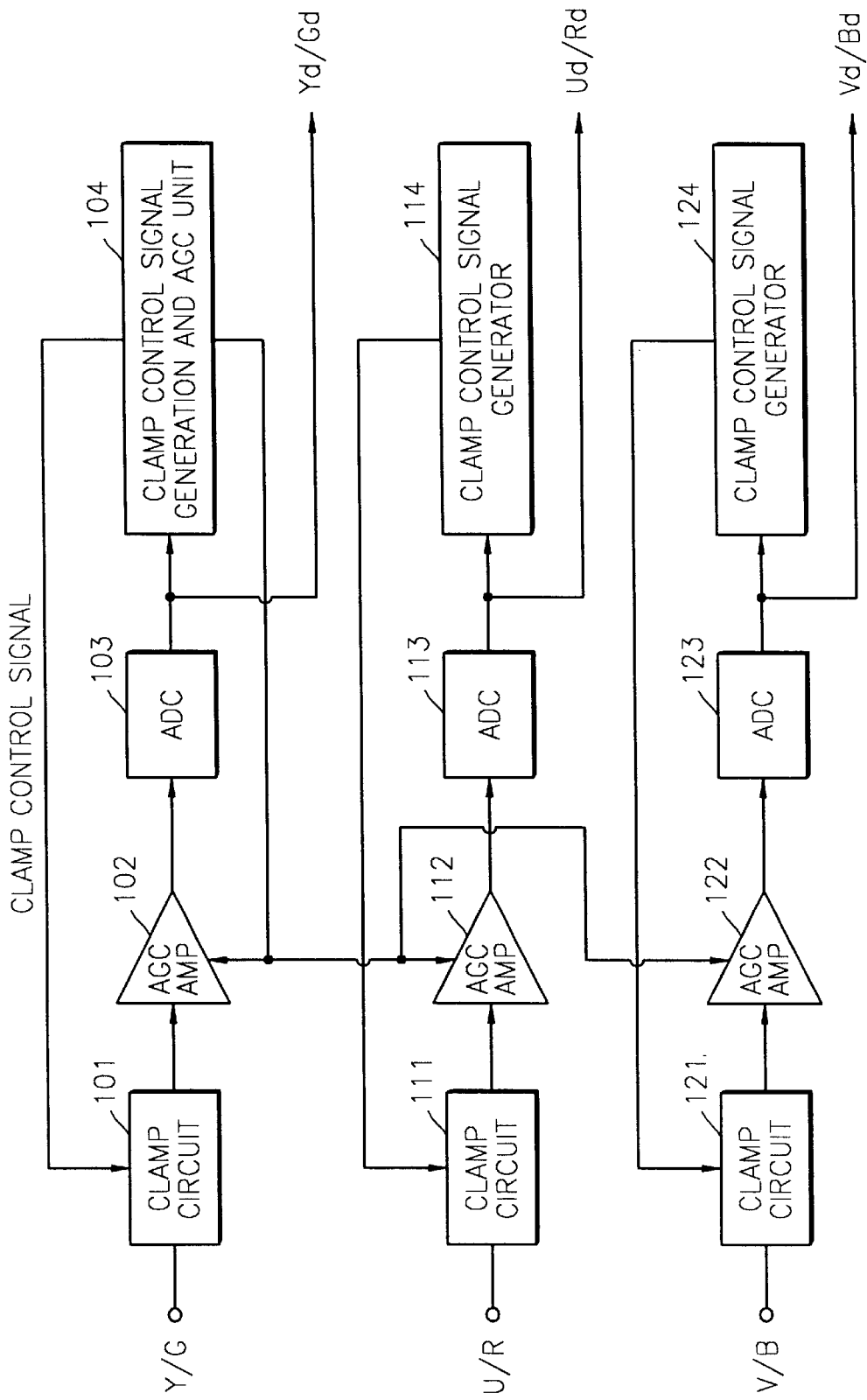
FIG. 1 is a block diagram of an image processing apparatus having an ADC according to the present invention.

FIG. 1 is a block diagram of an image processing apparatus having an ADC according to the present invention. Referring to FIG. 1, the image processing apparatus includes a clamp circuit 101, an AGC amplifier 102, an ADC 103, a clamp control signal generation and AGC unit 104 for an input analog Y or G signal, a clamp circuit 111, an AGC amplifier 112, an ADC 113, a clamp control signal generator 114 for an input analog U or R signal, a clamp circuit 121, an AGC amplifier 122, an ADC 123, and a clamp control signal generator 124 for an input analog V or B signal. Although the ADC is shown in FIG. 1 as having three components 103, 113 and 123, it is understood that the ADC may be implemented as one unit.

The image processing apparatus having the above-described configuration outputs digital $Y_dU_dV_d$ or $R_dG_dB_d$ signals corresponding to the analog YUV or RGB signals if the analog YUV or RGB signals are input.

In other words, if the clamp circuit 101 receives an analog Y or G signal, the clamp circuit 101 stabilizes the bias level of a synchronous signal contained in the analog Y or G signal using a clamp control signal transmitted from the clamp control signal generation and AGC unit 104. Here, the bias level of the synchronous signal may be sync tip of horizontal and vertical synchronous signal pulses or pedestal level contained in the analog Y or G signal. If the pedestal level is set to the bias level, the clamp circuit 101 uniformly controls the pedestal level of the analog Y or G signal level using the clamp control signal.

The AGC amplifier 102 amplifies the level of the analog Y or G signal to a predetermined value according to the amplification gain determined by an AGC signal so that the level of the synchronous signal contained in the analog Y or G signal output from the clamp circuit 101 is the reference level of the synchronous signal. The level of the synchronous signal represents the difference between the sync tip level and the pedestal level.

The ADC 103 converts the analog Y or G signal output from the AGC amplifier 102 into a digital $Y_d$ or $G_d$ signal in an existing way. The digital $Y_d$ or $G_d$ signal is transmitted to the clamp control signal generation and AGC unit 104 and also to an optional component (not shown), which is positioned at the back node of the ADC 103, in order to process an image in a desired way. For example, if a color matrix (not shown) is connected to the back node of the ADC 103, the digital $Y_d$ or $G_d$ signal is transmitted to the color matrix.

If the clamp control signal generation and AGC unit 104 receives the digital $Y_d$ or $G_d$ signal from the ADC 103, the clamp control signal generation and AGC unit 104 generates the clamp control signal for uniformly maintaining the bias level of the analog Y or G signal and outputs the AGC signal for controlling the level of the synchronous signal so as to be identical to the level of the reference synchronous signal.

Figure 2:
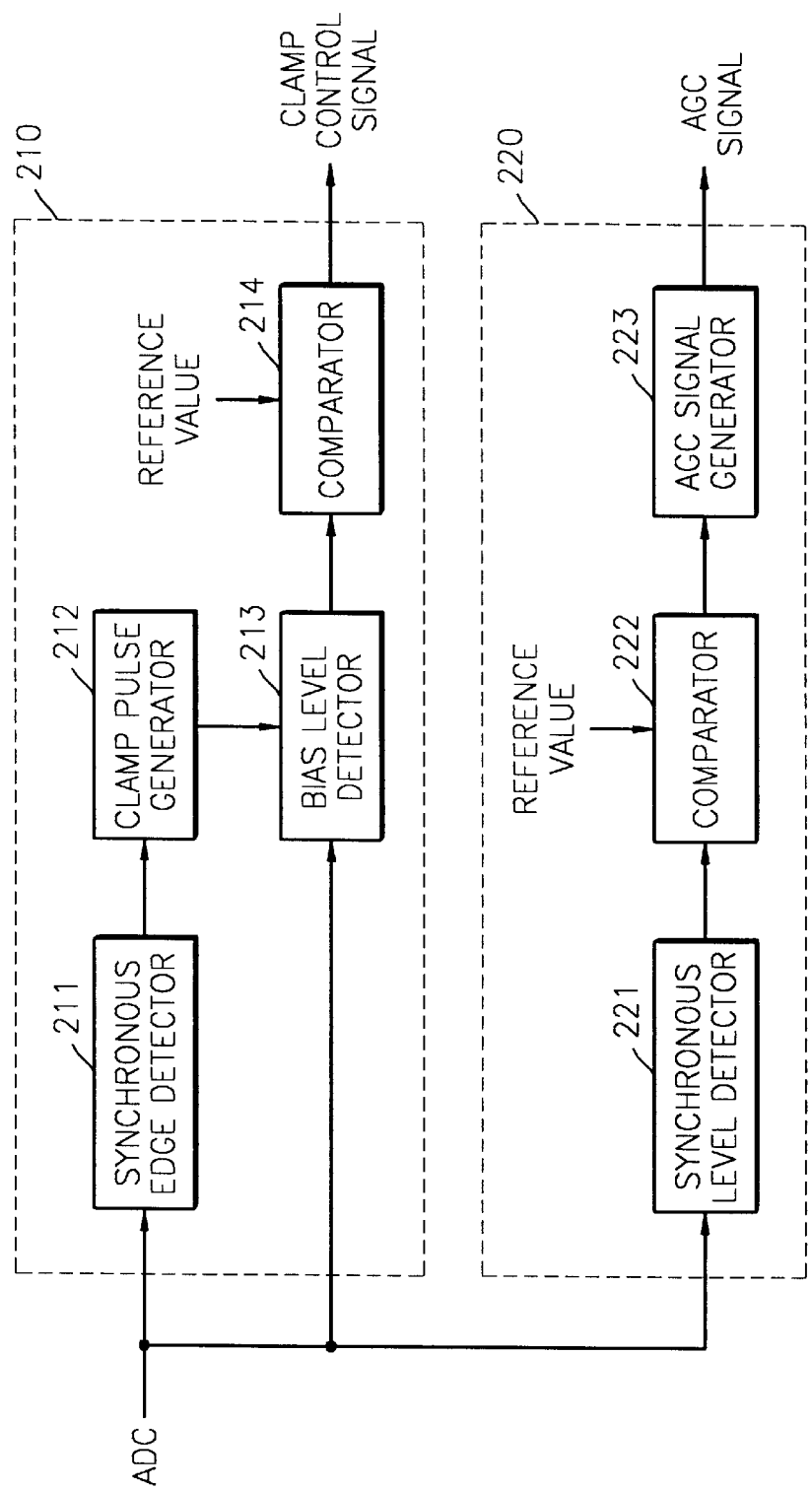
FIG. 2 is a detailed block diagram of a clamp control signal generation and automatic gain control (AGC) unit shown in FIG. 1.

As shown in FIG. 2, the clamp control signal generation and AGC unit 104 includes a clamp control signal generator 210 and an AGC signal generating means 220. The clamp control signal generator 210 includes a synchronous signal edge detector 211, a clamp pulse generator 212, a bias level detector 213, and a comparator 214.

The synchronous signal edge detector 211 detects falling edges of horizontal and vertical synchronous signal pulses from the digital $Y_d$ or $G_d$ signal. The clamp pulse generator 212 receives a signal, in which the falling edges are detected from the synchronous signal edge detector 211, to generate clamp pulses that are delayed for a predetermined period. The predetermined period is set so that the bias level is detected from the digital $Y_d$ or $G_d$ signal.

Accordingly, if the bias level is set to the sync tip, the clamp pulse generator 212 generates clamp pulses having a width sufficient for detecting the sync tip of the horizontal and vertical synchronous signal pulses from the bias level detector 213. However, if the bias level is set to the pedestal level, the clamp pulse generator 212 generates clamp pulses having a width sufficient for detecting the pedestal level of the horizontal and vertical synchronous signal pulses from the bias level detector 213.

The bias level detector 213 detects the level of the digital $Y_d$ or $G_d$ signal transmitted from the ADC 103 in a section of the clamp pulses transmitted from the clamp pulse generator 212 as the bias level and transmits the bias level to the comparator 214. The comparator 214 compares a reference value set to uniformly maintain the bias level of the digital $Y_d$ or $G_d$ signal and the bias level output from the bias level detector 213. If the bias level transmitted from the bias level detector 213 is lower than the reference value, the comparator 214 outputs a clamp control signal for increasing the bias level of the analog Y or G signal by the reference value. However, if the bias level transmitted from the bias level detector 213 is higher than the reference value, the comparator 214 outputs a clamp control signal for decreasing the bias level of the analog Y or G signal by the reference value. The clamp control signal is transmitted to the clamp circuit 101.

The AGC signal generating means 220 includes a synchronous signal level detector 221, a comparator 222, and an AGC signal generator 223. The AGC signal generating means 220 controls a gain so that the level of the synchronous signal contained in the digital $Y_d$ or $G_d$ signal transmitted from the ADC 103 satisfies the dynamic range in the ADC 103. In other words, the synchronous signal level detector 221 detects the sync tip and pedestal level of the horizontal and vertical signal pulses contained in the digital $Y_d$ or $G_d$ signal transmitted from the ADC 103. The synchronous signal level detector 221 detects the level of the synchronous signal contained in the analog Y or G signal using the difference between the detected sync tip and pedestal level.

The comparator 222 compares the level of the synchronous signal detected in the synchronous signal level detector 221 with the reference value. The reference value represents the standard level of the synchronous signal, which is set in consideration of the dynamic range in the ADC 103. The AGC signal generator 223 determines the gain of the AGC amplifier 102 using the difference between the level of the synchronous signal and the reference value transmitted from the comparator 222 and generates an AGC signal based on the determined gain.

In other words, if the level of the synchronous signal detected in the synchronous signal level detector 221 is higher than the reference value, the AGC signal generator 223 determines the gain of the AGC amplifier 102 so that the level of the synchronous signal contained in the input analog Y or G signal is reduced. If the level of the synchronous signal detected in the synchronous signal level detector 221 is lower than the reference value, the AGC signal generator 223 determines the gain of the AGC amplifier 102 so that the level of the synchronous signal contained in the input analog Y or G signal is increased. The gain of the AGC amplifier 102 determined in the AGC signal generator 223 is transmitted as the AGC signal to the AGC amplifier 102.

The AGC signal is also transmitted to the AGC amplifier 112 and the AGC amplifier 122. This is to uniformly maintain the transfer functions of a luminance signal and a chrominance signal. In other words, if the transfer functions of UV chrominance signals are fixed and the transfer function of a Y luminance signal rises due to the AGC signal, the color of a displayed screen becomes fainter. If the transfer functions of the UV chrominance signals are fixed and the transfer function of the Y luminance signal falls due to the AGC signal, the color of the displayed screen becomes darker. Thus, the gain of UV or RB signals is automatically controlled when the gain of the Y or G signal is automatically controlled to prevent the color of the displayed screen from becoming fainter or darker.

The clamp circuit 111 stabilizes the bias level of a synchronous signal contained in an input analog U or R signal using a clamp control signal transmitted from the clamp control signal generator 114.

The clamp control signal generator 114 has the same configuration as the clamp control signal generating means 210 shown in FIG. 2. Thus, the clamp control signal generator 114 transmits the clamp control signal, which is obtained by comparing the bias level of a digital $U_d$ or $R_d$ signal transmitted from the ADC 113 with a reference value, to the clamp circuit 111.

The AGC amplifier 112 controls and outputs the gain of an analog U or R signal transmitted from the clamp circuit 111 using the AGC signal transmitted from the clamp control signal generation and AGC unit 104. The ADC 113 converts the analog U or R signal transmitted from the AGC amplifier 112 into a digital signal $U_d$ or $R_d$ and transmits the digital $U_d$ or $R_d$ signal to the clamp control signal generator 114 and a component (not shown) at the back node of the clamp control signal generator 114.

The clamp circuit 121 stabilizes the bias level of a synchronous signal contained in an input analog V or B signal using a clamp control signal transmitted from the clamp control signal generator 124.

The clamp control signal generator 124 has the same configuration as the clamp control signal generator 210 shown in FIG. 2. Thus, the clamp control signal generator 124 transmits a clamp control signal, which is obtained by comparing the bias level of a digital $V_d$ or $B_d$ signal transmitted from the ADC 123 with a reference value, to the clamp circuit 121.

The AGC amplifier 122 controls and outputs the gain of the analog V or B signal transmitted from the clamp circuit 121 using the AGC signal transmitted from the clamp control signal generation and AGC unit 104. The ADC 123 converts the analog V or B signal transmitted from the AGC amplifier 122 into the digital $V_d$ or $B_d$ signal and transmits the digital $V_d$ or $B_d$ signal to the clamp control signal generator 124 and a component (not shown) at the back node of the clamp control signal generator 124.

As described above, the levels of synchronous signals contained in analog YUV or RGB signals input into an ADC are clamped and automatic gain controlled. As a result, the ADC can convert the analog YUV or RGB signals having the same levels of the synchronous signals into digital $Y_dU_dV_d$ or $R_dG_dB_d$ signals regardless of the levels of the synchronous signals contained in the YUV or RGB signals. Thus, the saturation phenomenon can be prevented from occurring in the digital $Y_dU_dV_d$ or $R_dG_dB_d$ signals.

The headroom of the ADC is minimized and the amplification gain of UV chrominance signals is controlled by the amplification gain of the AGC signal determined by a Y luminance signal. Thus, the transfer functions of a luminance signal and a chrominance signal coincide with each other. As a result, bit resolution can be prevented from being deteriorated.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. An image processing apparatus having an analog/digital converter (ADC) for converting input analog luminance and chrominance signals into digital luminance and chrominance signals, the image processing apparatus comprising:
    an automatic gain control signal generator which generates an automatic gain control signal, which controls the levels of the analog luminance and chrominance signals, using the level of a synchronous signal detected from a digital luminance signal output from the ADC;
    an automatic gain control amplifier for amplifying the level of an analog luminance signal by a predetermined value using the automatic gain control signal generated in the automatic gain control signal generator and transmitting the amplified level of the analog luminance signal to the ADC; and
    a plurality of automatic gain control amplifiers for amplifying the levels of analog first and second chrominance signals corresponding to the analog luminance signal by predetermined values using the automatic gain control signal generated in the automatic gain control signal generator and transmitting the amplified levels of analog first and second chrominance signals to the ADC.

2. The image processing apparatus of claim 1, wherein the automatic gain control amplifier amplifies the level of a synchronous signal contained in the analog luminance signal by a predetermined value, and the plurality of automatic gain control amplifiers amplify the levels of synchronous signals contained in the analog first and second chrominance signals by predetermined values.

3. The image processing apparatus of claim 1, wherein the automatic gain control signal generating means comprises:
    a synchronous signal level detector for detecting the levels of the synchronous signals;
    a comparator for comparing the levels of the synchronous signals detected in the synchronous signal level detector with a predetermined reference value; and
    an automatic gain control signal generator for determining the automatic gain based on a comparison result in the comparator and generating an automatic gain control signal based on the determined gain.

4. The image processing apparatus of claim 1, further comprising:
    a first clamp control signal generator for generating a first clamp control signal using a bias level detected from the digital luminance signal transmitted from the ADC;
    a second clamp control signal generator for generating a second clamp control signal using a bias level detected from a digital first chrominance signal transmitted from the ADC;
    a third clamp control signal generator for generating a third clamp control signal using a bias level detected from a digital second chrominance signal transmitted from the ADC;
    a first clamp circuit for clamping the analog luminance signal using the first clamp control signal transmitted from the first clamp control signal generator;
    a second clamp circuit for clamping the analog first chrominance signal using the second clamp control signal transmitted from the second clamp control signal generator; and
    a third clamp circuit for clamping the analog second chrominance signal using the third clamp control signal transmitted from the third clamp control signal generator.

5. The image processing apparatus of claim 4, wherein each of said clamp control signal generators comprises:
- a synchronous signal edge detector for detecting edges of a synchronous signal contained in a digital signal transmitted from the ADC;
- a clamp pulse generator for generating clamp pulses, which are delayed for a predetermined period starting the time when the edges are detected from the synchronous signal edge detector;
- a bias level detector for detecting the bias level of the digital signal using the clamp pulses generated from the clamp pulse generator;
- a comparator for comparing the bias level of the digital signal detected from the bias level detector with a predetermined reference value to generate the clamp control signal.

6. The image processing apparatus of claim 4, wherein the luminance signal is a Y luminance signal, the first chrominance signal is a U chrominance signal, and the second chrominance signal is a V chrominance signal.

7. An image processing apparatus having an ADC for converting input analog RGB color signals into digital RGB color signals, the image processing apparatus comprising:
- an automatic gain control signal generator for generating an automatic gain control signal, which controls the levels of the analog RGB color signals using the level of a synchronous signal detected from a first color signal of the digital RGB color signals;
- an automatic gain control amplifier for amplifying the analog level of the first color signal by a predetermined value using the automatic gain control signal generated in the automatic gain control signal generator and transmitting the analog level of the first color signal to the ADC;
- a plurality of automatic gain control amplifiers for amplifying the levels of analog color signals corresponding to the first color signal by predetermined values using the automatic gain control signal generated in the automatic gain control signal generator and transmitting the levels of the analog color signals to the ADC.

8. The image processing apparatus of clam 7, wherein the automatic gain control signal generator generates the automatic gain control signal using the level of a synchronous signal contained in a G color signal of the RGB color signals.

* * * * *